(12) United States Patent
Kronholz et al.

(10) Patent No.: US 8,987,144 B2
(45) Date of Patent: Mar. 24, 2015

(54) HIGH-K METAL GATE ELECTRODE STRUCTURES FORMED BY CAP LAYER REMOVAL WITHOUT SACRIFICIAL SPACER

(75) Inventors: Stephan Kronholz, Dresden (DE); Markus Lenski, Dresden (DE); Hans-Juergen Thees, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 174 days.

(21) Appl. No.: 13/198,107

(22) Filed: Aug. 4, 2011

(65) Prior Publication Data

US 2012/0161243 A1 Jun. 28, 2012

(30) Foreign Application Priority Data

Dec. 22, 2010 (DE) .......................... 10 2010 063 907

(51) Int. Cl.
| | |
|---|---|
| *H01L 21/302* | (2006.01) |
| *H01L 21/8238* | (2006.01) |
| *H01L 21/311* | (2006.01) |
| *H01L 29/165* | (2006.01) |
| *H01L 29/66* | (2006.01) |
| *H01L 29/78* | (2006.01) |
| *H01L 21/3115* | (2006.01) |

(52) U.S. Cl.
CPC .. *H01L 21/823864* (2013.01); *H01L 21/31116* (2013.01); *H01L 21/823807* (2013.01); *H01L 21/823814* (2013.01); *H01L 29/165* (2013.01); *H01L 29/6656* (2013.01); *H01L 29/6659* (2013.01); *H01L 29/66636* (2013.01); *H01L 29/7834* (2013.01); *H01L 29/7843* (2013.01); *H01L 29/7848* (2013.01); *H01L 21/31155* (2013.01); *H01L 29/6653* (2013.01)

USPC ........... 438/738; 438/733; 438/706; 438/285; 257/369; 257/E21.619; 257/E27.062

(58) Field of Classification Search
CPC ................. H01L 21/823864; H01L 21/31155; H01L 21/823807; H01L 21/823814; H01L 29/165; H01L 29/7848; H01L 29/6656; H01L 29/6659; H01L 29/66636; H01L 29/7834; H01L 29/7843; H01L 29/6653
USPC ........... 257/E21.619, 369, E27.062; 438/285, 438/738, 706, 733
See application file for complete search history.

(56) References Cited

U.S. PATENT DOCUMENTS

| | | | | |
|---|---|---|---|---|
| 3,660,735 | A * | 5/1972 | McDougall | .................... 257/387 |
| 4,994,404 | A * | 2/1991 | Sheng et al. | .................. 438/297 |
| 6,573,133 | B2 * | 6/2003 | Roy et al. | ...................... 438/212 |

(Continued)

OTHER PUBLICATIONS

Translation of Official Communication from German Patent Application No. 10 2010 063 907.9 dated Aug. 25, 2011.

*Primary Examiner* — Fernando Toledo
*Assistant Examiner* — Peter Bradford
(74) *Attorney, Agent, or Firm* — Amerson Law Firm, PLLC

(57) ABSTRACT

In sophisticated semiconductor devices, high-k metal gate electrode structures may be formed in an early manufacturing stage with superior integrity of sensitive gate materials by providing an additional liner material after the selective deposition of a strain-inducing semiconductor material in selected active regions. Moreover, the dielectric cap materials of the gate electrode structures may be removed on the basis of a process flow that significantly reduces the degree of material erosion in isolation regions and active regions by avoiding the patterning and removal of any sacrificial oxide spacers.

15 Claims, 7 Drawing Sheets

(56) References Cited

U.S. PATENT DOCUMENTS

| | | |
|---|---|---|
| 2004/0175911 A1* | 9/2004 | Mehrad et al. ............... 438/595 |
| 2008/0173934 A1* | 7/2008 | Lee et al. ..................... 257/327 |
| 2009/0023258 A1 | 1/2009 | Liang et al. |
| 2009/0039437 A1 | 2/2009 | Ogawa |
| 2009/0085126 A1* | 4/2009 | Yu et al. ....................... 257/377 |
| 2010/0041189 A1 | 2/2010 | Mueller et al. |
| 2010/0221878 A1* | 9/2010 | Yu et al. ....................... 438/216 |
| 2010/0289080 A1* | 11/2010 | Wei et al. ..................... 257/347 |

* cited by examiner

HIGH-K METAL GATE ELECTRODE STRUCTURES FORMED BY CAP LAYER REMOVAL WITHOUT SACRIFICIAL SPACER

BACKGROUND OF THE INVENTION

1. Field of the Invention

Generally, the present disclosure relates to the fabrication of highly sophisticated integrated circuits including transistor elements that comprise a high-k metal gate electrode structure formed in an early process stage.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling in combination with sophisticated lateral and vertical dopant profiles in the drain and source regions to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Thus, relatively high leakage currents are caused by the direct tunneling of charge carriers through an ultra-thin silicon dioxide gate insulation layer and may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, also appropriate metal-containing materials may have to be incorporated since the required work function values for P-channel transistors and N-channel transistors may not be obtained on the basis of standard polysilicon gate materials. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided. The process of fabricating a sophisticated gate electrode structure on the basis of a high-k dielectric material may require a moderately complex process sequence since, for instance, the adjustment of an appropriate work function for the transistors of different conductivity type and the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein, in the typical electrode material, polysilicon may be replaced in a very advanced manufacturing stage with appropriate metals for adjusting the work function of the different transistors and for providing a highly conductive electrode metal. While this approach may provide superior uniformity of the work function and thus of the threshold voltage of the transistors, since the actual adjustment of the work function may be accomplished after any high temperature processes, a complex process sequence for providing the different work function metals in combination with the electrode metal may be required. In other very promising approaches, the sophisticated gate electrode structures may be formed in an early manufacturing stage, while the further processing may be based on the plurality of well-established process strategies. In this case, the high-k dielectric material and any metal species for adjusting the work function may be provided prior to or upon patterning the gate electrode stack, which may comprise well-established materials, such as silicon and silicon/germanium, thereby enabling the further processing on the basis of well-established process techniques. On the other hand, the gate electrode stack and, in particular, the sensitive high-k dielectric materials, in combination with any metal-containing cap layers, have to be reliably confined by appropriate materials throughout the entire processing of the semiconductor device.

Further concepts for enhancing performance of transistors have been developed by providing a plurality of strain-inducing mechanisms in order to increase the charge carrier mobility in the channel regions of the various transistors. It is well known that charge carrier mobility in silicon may be efficiently increased by applying certain strain components, such as tensile and compressive strain for N-channel transistors and P-channel transistors, respectively, so that superior transistor performance may be obtained for an otherwise identical transistor configuration compared to non-strained silicon materials. For instance, efficient strain-inducing mechanisms may be implemented by incorporating a strained semiconductor material in the drain and source regions of transistors, for instance in the form of a silicon/germanium alloy, a silicon/carbon alloy and the like, wherein the lattice mismatch between the semiconductor alloy and the silicon base material may result in a tensile or compressive state, which in turn may induce a desired type of strain in the channel region of the transistor. Other efficient strain-inducing mechanisms are well established in which a highly stressed dielectric material may be positioned in close proximity to the transistor, thereby also inducing a certain type of strain in the channel region.

Although the approach of providing a sophisticated high-k metal gate electrode structure in an early manufacturing stage, possibly in combination with additional strain-inducing mechanisms, may have the potential of providing extremely powerful semiconductor devices, such as CPUs, storage devices, systems on a chip (SOC) and the like, conventional approaches may still suffer from process non-uniformities, as will be described with reference to FIGS. 1a-1e.

FIG. 1a schematically illustrates a cross-sectional view of a semiconductor device 100 comprising a substrate 101, such as a silicon substrate, in combination with a semiconductor layer 102, such as a silicon layer or a semiconductor material which contains a significant amount of silicon. In the manufacturing stage shown, the semiconductor device 100 comprises transistors 150A, 150B formed in and above respective active regions 102A and 102B. An active region is to be understood as a semiconductor region in the layer 102 in which PN junctions for one or more transistors are to be formed. An isolation structure 102C, such as a trench isolation, is provided in the semiconductor layer 102 and may be formed so as to be adjacent to the active region 102A, wherein it should be appreciated that the isolation structure 102C may also be provided laterally between the active regions 102A, 102B, thereby electrically isolating these regions, at least in the horizontal direction. Furthermore, a plurality of gate electrode structures 160A, 160B and 160C are formed above the semiconductor layer 102. In FIG. 1a, the gate electrode structures 160A, 160B are illustrated at a cross-section in which the gate electrode structures 160A, 160B are formed on the active regions 102A and 102B, respectively, wherein it should be appreciated that these gate electrode structures typically extend beyond the corresponding active region and thus these gate electrode structures may also be formed above the isolation region 102C. For example, the gate electrode structure 160C may represent a corresponding portion of a gate electrode structure that may extend into an active region along the direction perpendicular to the drawing plane of FIG. 1a. In other cases, the gate electrode structure 160C may represent a portion of the gate electrode structure 160A. In other words, in this case, the gate electrode structure 160C may represent a "continuation" of the gate electrode structure 160A in a direction perpendicular to the drawing plane of FIG. 1a. At any rate, the gate electrode structure 160C may be formed above a portion of the isolation structure 102C, which is in close proximity to the active region 102A.

As previously discussed, the gate electrode structures may comprise a gate insulation layer 161 formed on the active regions 102A, 102B, respectively, and the gate insulation layer may comprise a high-k dielectric material, such as hafnium oxide-based materials and the like. It is to be noted that frequently the gate insulation layer 161 may additionally comprise a conventional dielectric material, such as a silicon oxide-based material, however, with a significantly reduced thickness of approximately 0.8 nm and less. Furthermore, a metal-containing material is typically formed on the gate insulation layer 161 when comprising the high-k dielectric material, wherein the corresponding metal-containing material may be provided with different material composition for transistors of different conductivity type in order to adjust an appropriate work function for the corresponding gate electrode structure. For example, a conductive cap layer 162A is provided in the gate electrode structures 160A, 160C, which may correspond to the same conductivity type of a transistor. Thus, the cap layer 162A typically has incorporated therein a work function metal species for the transistor 150A, while a conductive cap layer 162B includes an appropriate work function metal species for the transistor 150B. Furthermore, the gate electrode structures may comprise a further electrode material 163, such as silicon, silicon/germanium and the like, followed by a dielectric cap layer or layer system which, however, may have a different thickness for the gate electrode structures 160A, 160C on the one hand, and the gate electrode structure 160B on the other hand, due to a different exposure to reactive process atmospheres applied during the previous processing. Thus, the dielectric cap layers 164A of the structures 160C, 160A may have a thickness of, for instance, 20-40 nm, while the thickness of the cap layer 164B may be greater by approximately 15-25 nm.

Furthermore, a sidewall spacer structure 165, for instance comprising a liner material 165A in combination with a spacer element 165B, may be provided so as to protect the sidewalls of the electrode material 164, and in particular of the sensitive materials 162A, 162B and 161. The liner 165A and the spacer element 165B are typically comprised of silicon nitride. As illustrated, the materials of the components 165A, 165B may be provided in the form of a non-patterned layer system above the active region 102B and the gate electrode structure 160B so as to act as an efficient mask material during a process sequence for forming a strain-inducing semiconductor material 151, such as a silicon/germanium material, in the active region 102A. As discussed above, in sophisticated applications, performance of P-channel transistors may be significantly increased upon incorporating a strain-inducing silicon/germanium alloy into the active region of the P-channel transistor, since in this case a significant compressive strain may be induced in a channel region 152. It should be appreciated that, if required, a threshold adjusting semiconductor material, indicated as 152A, may be provided in the channel region 152, if required for appropriately adjusting the overall threshold voltage of the transistor 150A.

The semiconductor device 100 as illustrated in FIG. 1a may be formed on the basis of the following process strategies. After forming the isolation region 102C and, thus, laterally delineating the active regions 102A, 102B and any other active regions, the material layer 152A, if required, may be selectively formed in the active region 102A. Next, appropriate materials for the gate insulation layer 161 and the layers 162A, 162B may be formed by appropriate deposition techniques and patterning sequences, possibly in combination with any thermal treatments in order to diffuse a work function metal species into the gate dielectric layers 161, if considered appropriate. In other cases, a desired work function metal species may be deposited in the form of a continuous material layer, which may then be patterned so as to form a desired material layer above the corresponding active regions. Thereafter, the electrode material 163, for instance in the form of amorphous or polycrystalline silicon, is deposited by using well-established deposition techniques, followed by the deposition of the dielectric cap layer or layer system 164A, 164B. If required, any additional materials, such as anti-reflective coating (ARC) materials and the like, may be provided, if required, and a sophisticated lithography process sequence and anisotropic etch processes are applied in order to obtain the gate electrode structures 160A, 160B, 160C according to the design rules. For example, a length of the gate electrode structures, i.e., the horizontal extension of the electrode materials 162A, 162B, may be 50 nm and less. Next, the material layers 165S are deposited, for instance by thermally activated chemical vapor deposition (CVD), plasma enhanced CVD, low pressure CVD, multi-layer deposition techniques, in order to obtain the desired material characteristics. For example, silicon nitride may be deposited so as to form a dense liner, followed by the deposition of a further silicon nitride material for the spacer elements 165B. As discussed above, when adjusting the work function and thus the basic threshold voltage of the transistors 150A, 150B upon patterning the gate electrode structures 160A, 160B, a reliable confinement of the layers 161 and 162A, 162B has to be guaranteed during the further processing since any exposure to the active process atmospheres, such as oxygen-containing chemicals and the like, may result in a significant shift of the previously adjusted transistor characteristics.

Thereafter, an etch mask (not shown) is formed so as to cover the transistor 150B while exposing the active region 102A and the portion of the isolation region 102C having formed thereon the gate electrode structure 160C. As discussed above, the gate electrode structures 160A, 160C may represent one and the same gate electrode structure or structures that are provided in close proximity and correspond to an area of P-type transistors. During the corresponding anisotropic etch processes, well-established plasma-based recipes are applied so as to etch through the previously deposited layers 165S, thereby forming the spacer structure 165 on the gate electrode structures 160C, 160A. Moreover, the etch process may be continued so as to etch into the active region 102A, possibly on the basis of a changed etch chemistry in order to form cavities therein, which are subsequently filled with the material 151. Consequently, during the cavity etch process, also the cap layers 164A are exposed to the reactive etch ambient and may thus suffer from a pronounced material erosion, which may result in the reduced thickness of these layers compared to the dielectric cap layer 164B, which may still be covered by the spacer layer 165S and corresponding resist mask.

Next, the device 100 is prepared for the selective deposition of the strain-inducing semiconductor material 151, which typically involves a plurality of cleaning recipes, which may result in a significant erosion of oxide-based materials, such as the insulating material in the isolation region 102C. Thus, a pronounced degree of recessing, indicated as 107C, is generated in the isolation region 102C, thereby also causing a certain degree of under-etching of the spacer structure 165 of the gate electrode structure 160C. Thereafter, the material 151 is selectively grown in the corresponding cavities by applying a selective epitaxial growth process based on well-established process recipes. Typically, the process parameters are selected such that a significant degree of material deposition may occur on more or less pure silicon surface areas, while dielectric surface areas, such as silicon nitride, silicon dioxide and the like, may substantially not receive the material 151.

FIG. 1b schematically illustrates the semiconductor device 100 in a manufacturing stage in which an etch mask 103 covers the active region 102A and a portion of the isolation region 102C comprising the gate electrode structure 160C, while the gate electrode structure 160B and the active region 102B are exposed to a reactive etch ambient 104. During the etch process 104, the spacer structure 165 is formed on sidewalls of the gate electrode structure 160B. Thus, during the process 104, the dielectric cap layer 164B may be exposed, wherein, however, a significantly reduced degree of material erosion may occur so that still a significant difference in thickness between the layer 164B and the layers 164A is preserved. After the etch process 104, the etch mask 103 may be removed and thus the gate electrode structures 160A, 160C may have a similar configuration, i.e., these structures comprise the sidewall spacer structure 165, which may be used as an offset spacer structure for controlling a subsequent implantation sequence for introducing a dopant species in order to form drain and source extension regions and halo regions, i.e., counter-doped regions, as required for obtaining the complex dopant profile for adjusting the overall transistor characteristics. On the other hand, due to the previous difference in the overall process flow, the cap layers 164A and 164B may differ significantly from each other with respect to their thickness in this manufacturing stage. During the further processing, the dielectric cap layers 164A, 164B have to be removed, which, however, may influence the configuration of the spacer structure 165 if comprised of a similar material. For instance, plasma-based etch recipes or wet chemical etch recipes may be applied which, however, may have a pronounced lateral etch rate, thereby causing a significant degree of material erosion in the spacer structure 165. For this reason, the spacer structure 165 is protected by a sacrificial oxide spacer element having a high etch resistivity with respect to an efficient nitride etch chemistry.

FIG. 1c schematically illustrates the semiconductor device 100 with an oxide spacer layer 166, which is etched during an etch process 105 in order to form sacrificial oxide spacers 166S on the sidewall spacer structures 165. During the etch process 105, a significant material erosion may also occur in the isolation structure 102C since a certain over-etch time is required in order to reliably expose the dielectric cap layers 164A, 164B. Consequently, the recess 107C in the isolation region 102C may be significantly increased and also a certain degree of recessing 107A, 107B is generated in the active regions 102A, 102B, respectively. Consequently, also a certain amount of the strain-inducing material 151 is removed during the etch process 105.

FIG. 1d schematically illustrates the device 100 when exposed to a further etch process 106 for removing the dielectric cap layers 164A, 164B on the basis of an appropriate etch chemistry, such as hot phosphoric acid and the like. It should be appreciated that the pronounced recess 107C in the isolation region 102C may result in a certain probability of under-etching the gate electrode structure 160C and attacking the sensitive materials, which may be highly disadvantageous in any areas close to the active region 102A, for example when the gate electrode structure 160C is the continuation of the gate electrode structure 160A along the direction perpendicular to the drawing plane of FIG. 1e, or in other cases when the gate electrode structure 160C is formed laterally adjacent to the active region 102A, as shown in FIG. 1e, however, with a very reduced offset, as may be required in some sophisticated device designs.

FIG. 1e schematically illustrates the semiconductor device 100 in a further advanced manufacturing stage. As illustrated, the sacrificial sidewall spacers 166S (FIG. 1d) are removed, which may be accomplished on the basis of diluted hydrofluoric acid (HF) which, however, also removes a certain portion of the isolation structure 102C, thereby even further increasing the recess 107C.

As a result, after the process sequence for encapsulating the sensitive gate materials, forming the strain-inducing material 151 and removing the dielectric cap materials, a pronounced degree of recessing 107C is generated in the isolation region 102C, while also material removal has occurred in the active region 102A, thereby removing a certain amount of strain-inducing material 151, which in turn may result in less pronounced performance of the transistor 150A. Furthermore, the further processing has to be continued on the basis of large differences in surface topography, which may generally result in a high degree of non-uniformity of the corresponding process techniques, for instance for incorporating dopant species based on appropriate implantation masks, forming a further spacer structure so as to adjust the lateral and vertical dopant profile and finally forming an interlayer dielectric material, possibly comprising highly stressed dielectric material layers and the like. Moreover, since integrity of the sensitive gate materials may have deteriorated due to the pronounced recessing of the gate electrode structure 160C at areas in close proximity to a neighboring active region, also pronounced device failures may be observed when completing the transistors 150A, 150B according to a process strategy, as discussed before.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which superior encapsulation of the sophisticated high-k metal gate electrode structures may be accomplished together with a less pronounced surface topography. It has been recognized that, in particular, the combination of reducing pronounced recesses in the isolation structures and the inferior encapsulation may result in significantly yield losses upon applying process strategies for forming sophisticated gate electrode structures with high-k dielectric material and work function species provided in an early manufacturing stage. For example, it has been recognized that the process of patterning and removing the sacrificial oxide spacer may significantly contribute to the pronounced recessing of the isolation regions and may also contribute to a loss of strain-inducing semiconductor material. Consequently, according to the principles disclosed herein, a process strategy is provided in which the removal of the dielectric cap layers may be accomplished with high efficiency without requiring the formation of sacrificial spacer elements, while at the same time superior process efficiency may be accomplished by forming an additional liner material for superior encapsulation of sensitive gate materials after the formation of the strain-inducing semiconductor material.

One illustrative method disclosed herein comprises forming a strain-inducing semiconductor material in a first active region of a first transistor in the presence of a first gate electrode structure that is formed on the first active region. A second active region of a second transistor and a second gate electrode structure formed thereon are covered in this phase by a first spacer layer, wherein the first gate electrode structure comprises a first spacer and a first dielectric cap layer and wherein the second gate electrode structure comprises a second dielectric cap layer. The method further comprises forming a second spacer layer above the first and second active regions after forming the strain-inducing semiconductor material. The method further comprises selectively modifying the second dielectric cap layer so as to increase an etch rate thereof. Moreover, the first and second dielectric cap layers are removed and drain and source regions are formed in the first and second active regions.

A further illustrative method disclosed herein relates to forming a semiconductor device. The method comprises forming a strain-inducing semiconductor alloy in a first active region in the presence of a first gate electrode structure of a first transistor while a second gate electrode structure and a second active region of a second transistor are masked. The first gate electrode structure comprises a first dielectric cap layer and the second gate electrode structure comprises a second dielectric cap layer. Moreover, the method comprises forming a spacer layer above the first and second gate electrode structures and the first and second active regions. Next, an etch rate of the second dielectric cap layer is selectively increased and an etch process is performed so as to expose portions of the first and second active regions and to form spacer elements on the first and second gate electrode structures.

One illustrative semiconductor device disclosed herein comprises a first gate electrode structure formed above a first active region of a first transistor and at least above a first portion of an isolation region, wherein the first gate electrode structure comprises a first high-k dielectric material. The semiconductor device further comprises a second gate electrode structure formed above a second active region of a second transistor, wherein the first and second transistors are of inverse conductivity type and wherein the second gate electrode structure comprises a second high-k dielectric material. The semiconductor device further comprises a first spacer structure formed on sidewalls of the first gate electrode structure and extending to a first height. Additionally, a second spacer structure is formed on sidewalls of the second gate electrode structure and extends to a second height that is greater than the first height. Furthermore, a first outer spacer structure is formed on the first spacer structure and a second outer spacer structure is formed on the second spacer structure.

BRIEF DESCRIPTION OF THE DRAWINGS

The disclosure may be understood by reference to the following description taken in conjunction with the accompanying drawings, in which like reference numerals identify like elements, and in which.

Figure 1A:
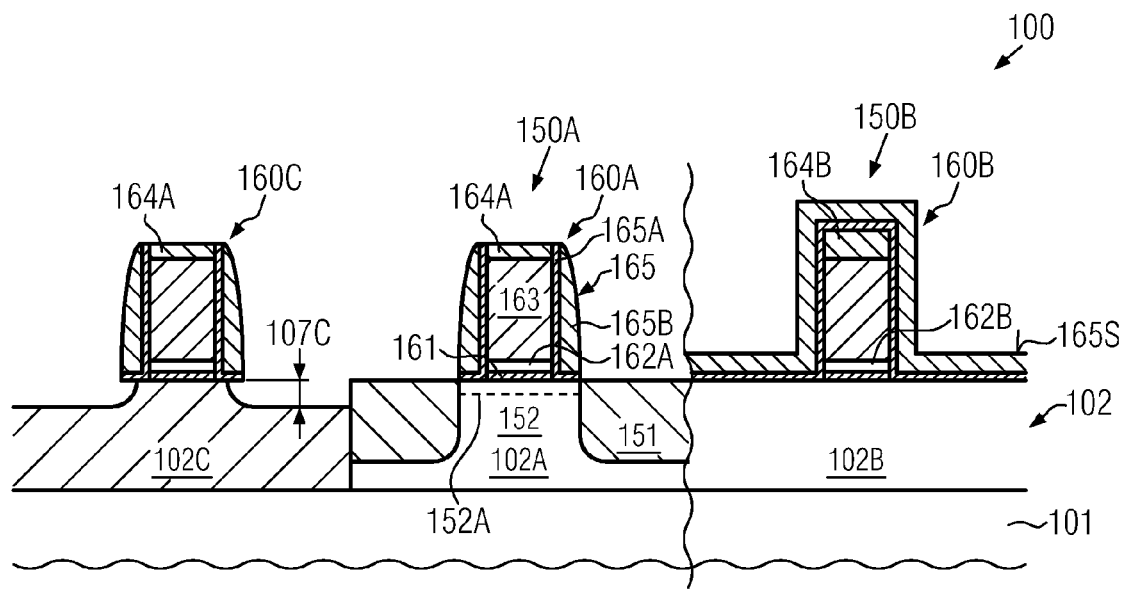
FIGS. 1a-1e schematically illustrate cross-sectional views of a semiconductor device during various manufacturing stages in providing a sophisticated high-k metal gate electrode structure in combination with a strain-inducing material on the basis of a conventional strategy in which integrity of the gate electrode structure is preserved on the basis of a sidewall spacer structure and a sacrificial oxide spacer.
Figure 1B:
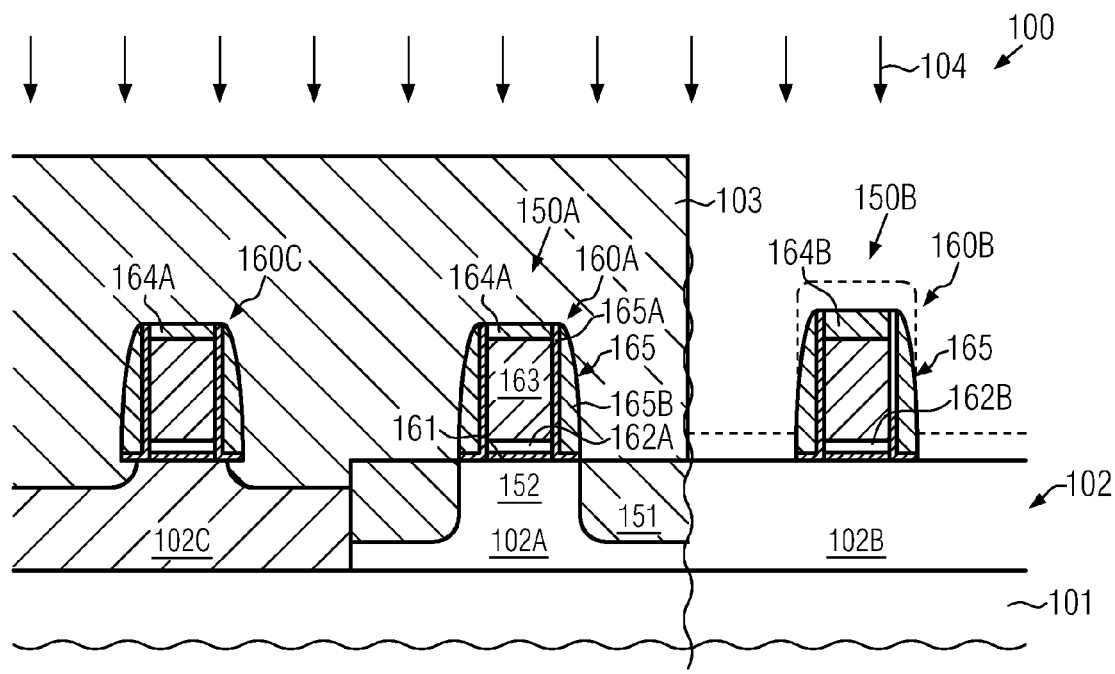
Figure 1C:
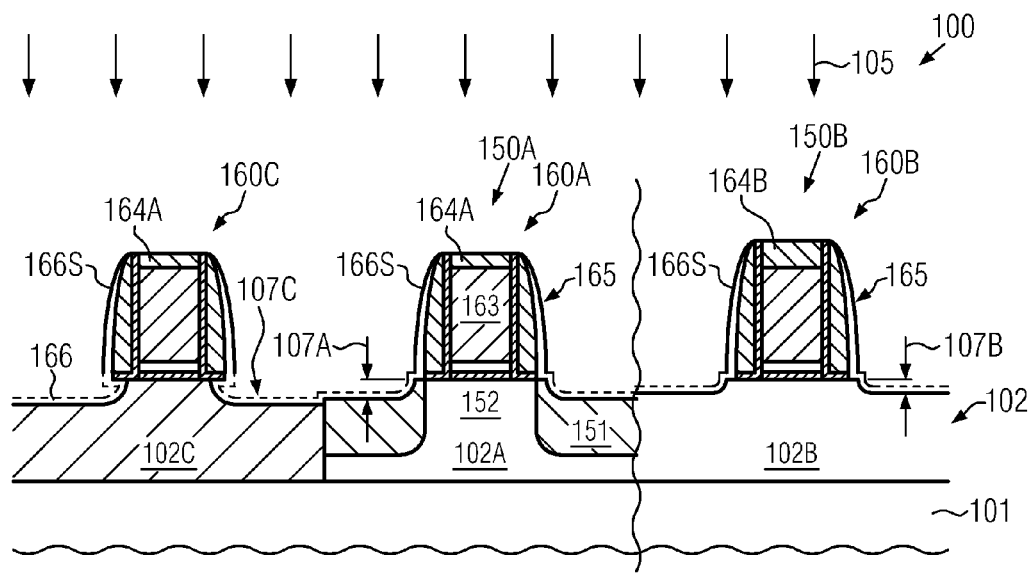
Figure 1D:
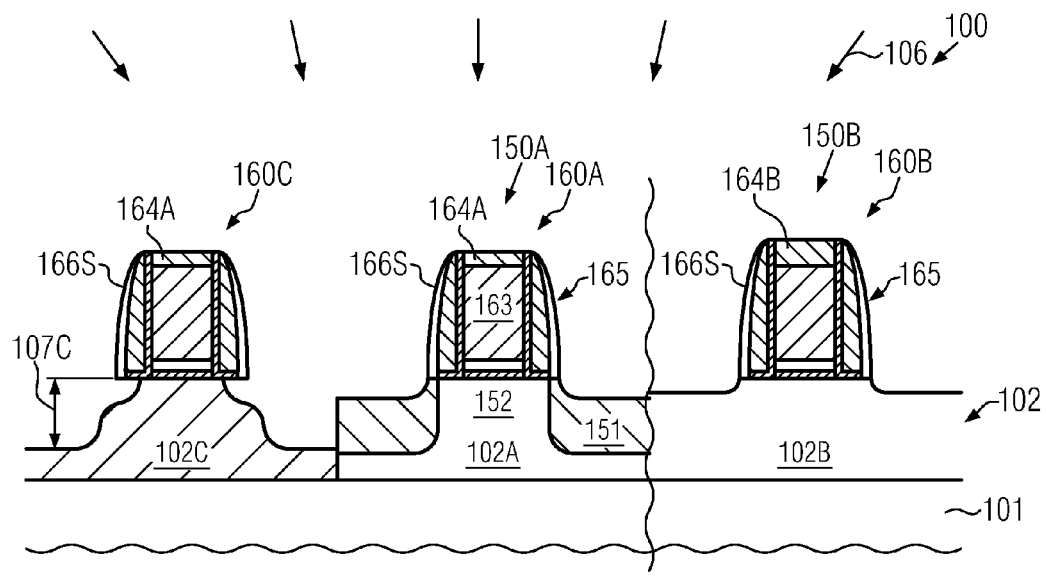
Figure 1E:
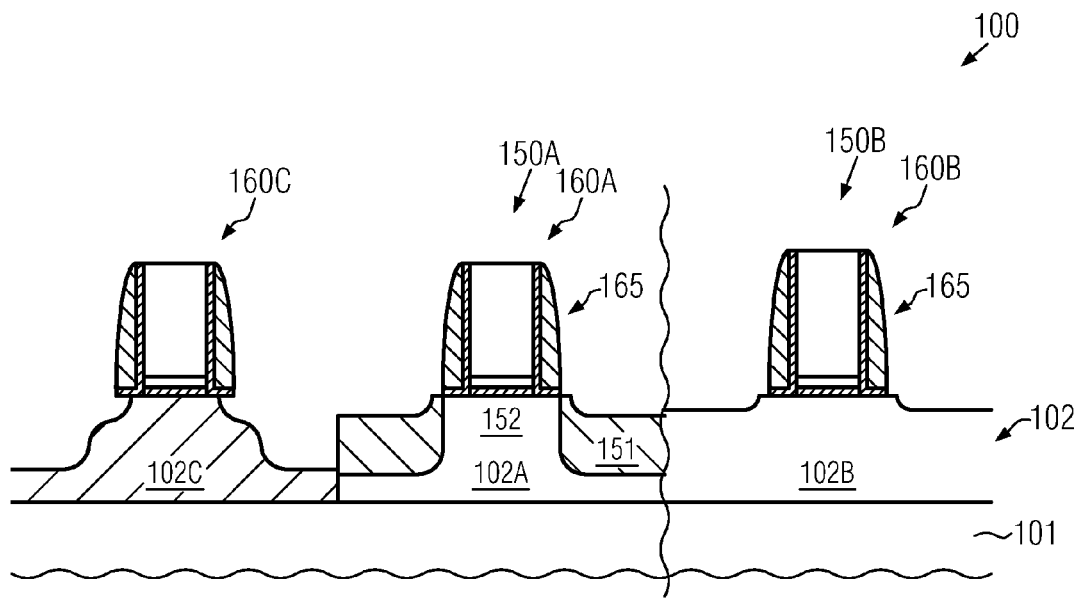

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally contemplates manufacturing techniques and corresponding semiconductor devices in which the difference in thickness of dielectric cap layers caused by the previous incorporation of a strain-inducing material in one type of transistor may be taken into account by appropriately modifying the etch rate selectively in the thicker dielectric cap layer, thereby reducing the time required for exposing sensitive device areas, such as active regions, to a reactive etch ambient. Furthermore, integrity of sensitive gate materials may be ensured by forming an appropriate liner material, which may be patterned into an additional spacer element upon removing the dielectric cap layers, wherein the spacer elements may be used for the further processing of the device, for instance with respect to incorporating drain and source dopant species and the like. On the other hand, the additional spacer layer provides superior integrity of the gate electrode structures after the incorporation of the strain-inducing semiconductor material, which may result in a certain probability of exposing any sensitive device areas. Thus, the further processing may be continued on the basis of a less pronounced surface topography, since, in particular, any processes for patterning and removing oxide-based sacrificial spacers may be omitted, while at the same time the exposure to reactive process atmospheres of the active regions and thus of the previously deposited strain-inducing semiconductor material may also be reduced.

With reference to FIGS. 2a-2h, further illustrative embodiments will now be described in more detail, wherein reference may also be made to FIGS. 1a-1e, if required.

Figure 2A:
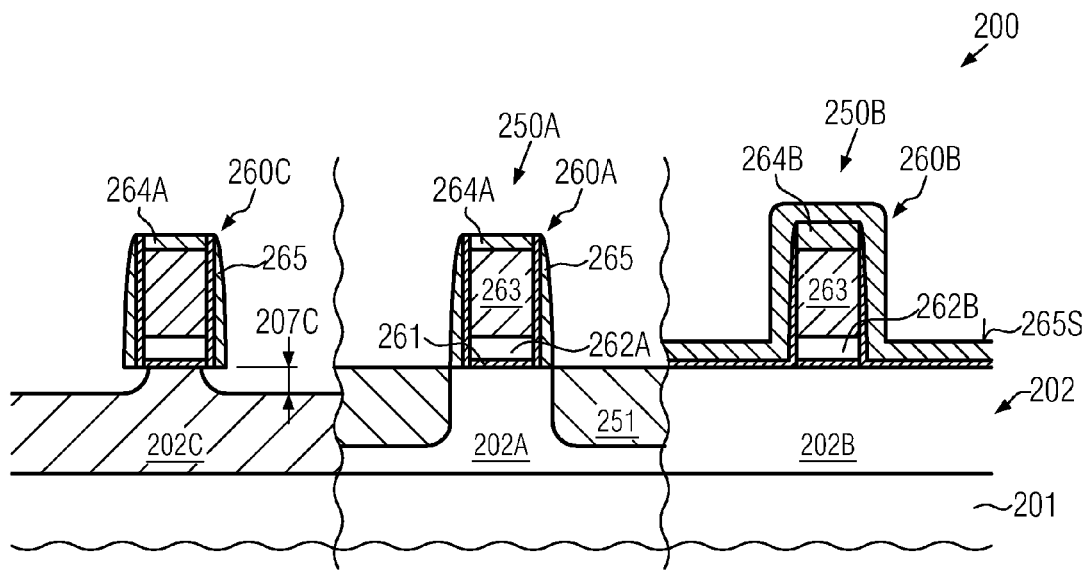
FIGS. 2a-2h schematically illustrate cross-sectional views of a semiconductor device during various manufacturing stages in forming high-k metal gate electrode structures in an early manufacturing stage, while reducing the degree of recessing upon incorporating a strain-inducing semiconductor material, while also the encapsulation and thus the integrity of sensitive gate materials may be enhanced, according to illustrative embodiments.

FIG. 2a schematically illustrates a cross-sectional view of a semiconductor device 200 comprising a substrate 201, a semiconductor layer 202, which is laterally divided into a plurality of active regions, such as regions 202A, 202B, by means of an isolation region 202C. The active regions 202A, 202B may, in some illustrative embodiments, correspond to a first transistor 250A and a second transistor 250B, wherein the first transistor 250A may require the incorporation of a strain-inducing semiconductor material 251 in order to enhance performance, while corresponding incorporation in the active region 202B may not be required. For example, the transistor 250A may be a P-channel transistor while the transistor 250B may be of inverse conductivity type. In the manufacturing stage shown, gate electrode structures 260A, 260B may be formed on the active regions 202A, 202B, respectively, and may represent high-k metal gate electrode structures. That is, the gate electrode structures 260A, 260B may comprise a gate dielectric material 261 in combination with a metal-containing electrode material 262A, 262B, respectively, followed by an electrode material 263. Furthermore, dielectric cap layers 264A, 264B may be provided with a different thickness, due to a difference of the previous process history, as is also discussed above. It should be appreciated that generally for any components described so far the same criteria may apply as previously explained with reference to the semiconductor device 100. Furthermore, a gate electrode structure 260C may be formed on the isolation region 202C in close proximity to the active region 202A. As discussed above, the gate electrode structure 260C may be understood as a continuation of the gate electrode structure 260A, as is also explained above, while in other cases the gate electrode structure 260C may represent a separate gate electrode structure formed in a portion of the isolation region 202C that is adjacent to the active region 202A. In this case, the gate electrode structures 260C, 260A may represent different portions of the same gate electrode structure or different electrode structures which may have experienced substantially the same process history during a corresponding masking regime applied for incorporating the strain-inducing semiconductor material 251 selectively in the active region 202A. Consequently, also the gate electrode structure 260C may comprise the dielectric cap layer 264A of reduced thickness. Moreover, the gate electrode structures 260A, 260C may comprise a spacer structure 265, while in the active region 202B the gate electrode structure 260B may be covered by a spacer layer 265S. It should be appreciated that the spacer structure 265 may have a similar configuration, for instance with respect to providing a liner and a spacer element, as is also discussed above with reference to the semiconductor device 100. In this case, also the spacer layer 265S may be comprised of two material layers. Furthermore, as shown, due to the previous processing, a certain degree of recessing 207C may have been created in the isolation region 202C.

The semiconductor device 200 as shown in FIG. 2a may be formed on the basis of similar process techniques as are also discussed above with reference to the semiconductor device 100 when referring to FIG. 1a.

Figure 2B:
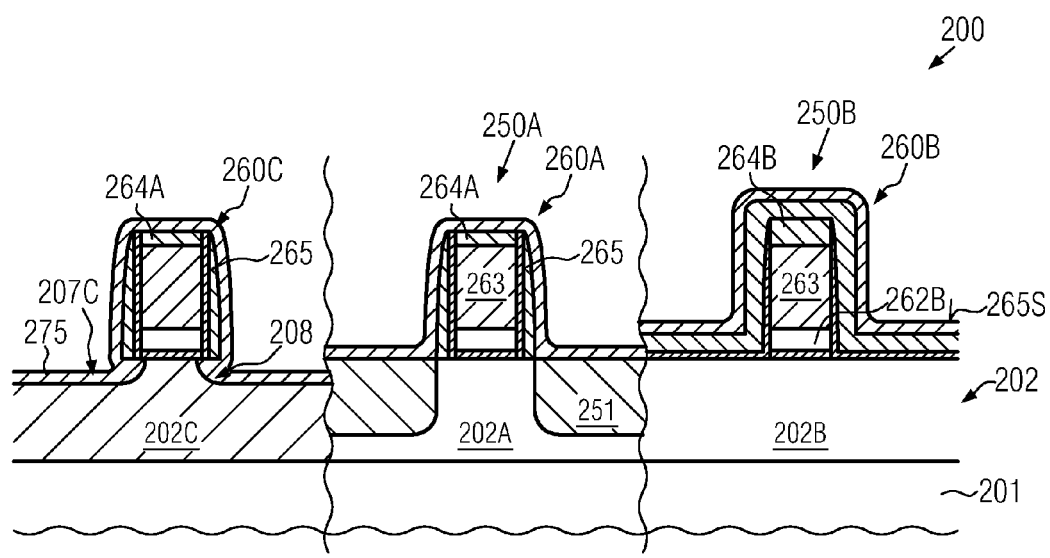

FIG. 2b schematically illustrates the semiconductor device 200 in a further advanced manufacturing stage. As illustrated, a further spacer layer 275 may be formed above the active regions 202A, 202B and the isolation region 202C and thus above and on sidewalls of the gate electrode structures 260A, 260B, 260C. The spacer layer 275 may be comprised of silicon nitride or any other appropriate material for reliably encapsulating critical device areas, such as an area 208 in the isolation region 202C. As discussed above, silicon nitride material may be deposited on the basis of well-established recipes, such as low pressure CVD, plasma CVD and the like, thereby obtaining a highly controllable deposition process with high step coverage and a sufficient material density as required for the protection of the sensitive device areas 208. The initial layer thickness of the spacer layer 275 may be appropriately selected so as to comply with the further processing of the device, i.e., with the subsequent patterning of layer 275 so as to form a further spacer element adjacent to the spacer structure 265 in order to determine an offset for performing implantation processes and the like. It should be appreciated that corresponding process parameters for the deposition and the etching of the material 275 may be determined in advance by experiments and the like.

Figure 2C:
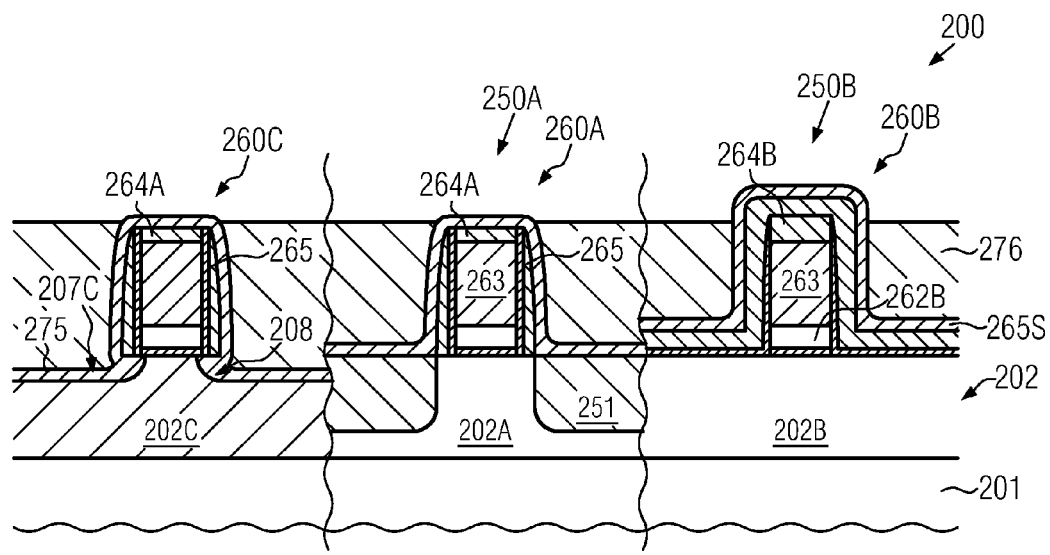

FIG. 2c schematically illustrates the device 200 in a further advanced manufacturing stage in which a sacrificial fill material 276, such as a polymer material and the like, may be formed above the active regions 202A, 202B and the isolation region 202C in order to laterally enclose at least a portion of the gate electrode structures 260A, 260B, 260C. The sacrificial fill material 276 may be applied on the basis of well-established spin-on techniques and the like, in which a highly non-conformal deposition behavior may result in a substantially planar surface topography, at least for the material 276. If required, the material 276 may be provided with a sufficient extra height so as to completely cover the gate electrode structures 260A, 260B, 260C, wherein, in some illustrative embodiments, an additional material removal process, such as an etch process and the like, may be applied so as to expose at least the spacer layer 275 above the gate electrode structure 260B. In this manner, superior accessibility of the material 275 and the underlying cap layer 264B may be achieved during the further processing for modifying the etch behavior of at least the cap material 264B.

Figure 2D:
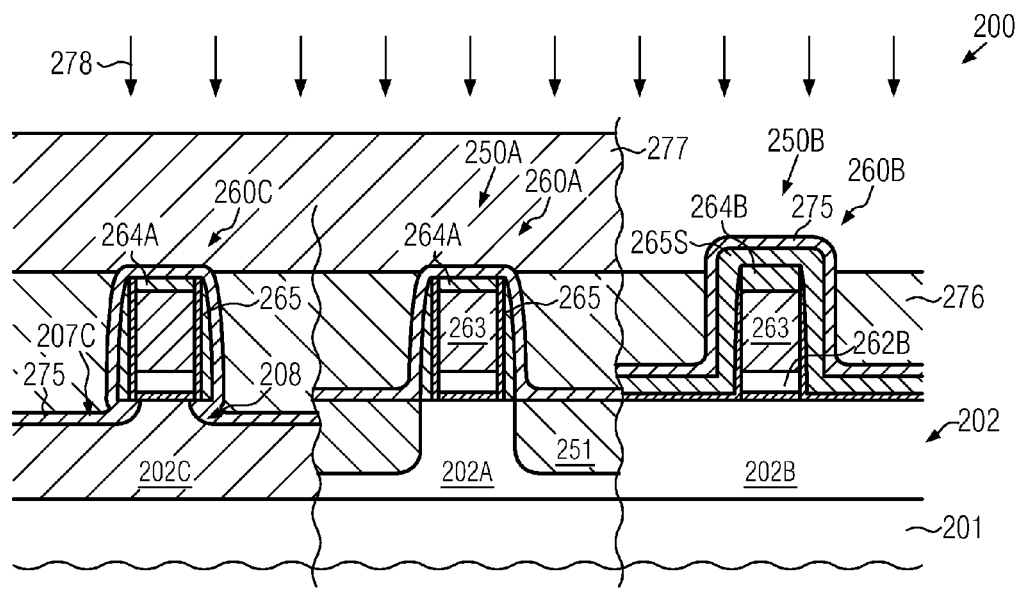

FIG. 2d schematically illustrates the device 200 in a further advanced manufacturing stage. As illustrated, a mask 277, such as a resist mask, may be formed so as to cover the gate electrode structures 260A, 260C, while fill material formed above the active region 202B may be exposed. To this end, any appropriate lithography process may be applied, for instance on the basis of lithography masks, as are typically required for selectively masking and exposing P-type areas and N-type areas. Moreover, a modification process 278 may be performed so as to at least modify the etch rate of the dielectric cap layer 264B, wherein also an exposed portion of the layer 275 and the underlying spacer layer 265S may be modified during the treatment 278. In some illustrative embodiments, the process 278 may represent an ion bombardment performed on the basis of an appropriate species, such as oxygen, which may thus be incorporated into the layer 264B and also to the desired degree into the above-lying layers 275 and 265S. On the other hand, the ion blocking capability of the fill material 276, if provided so as to extend above the gate electrode structures 260A, 260C, and of the mask 277 is appropriately adjusted so as to substantially avoid the incorporation of a corresponding species into the cap layers 264A. To this end, appropriate implantation parameters may be selected, for instance by using simulation programs and/or experiments. In other cases, any other appropriate species may be incorporated so as to modify the molecular structure, which in turn may result in an increased etch rate during the further processing of the device 200. In still other illustrative embodiments, the modification process 278 may result in the incorporation of an appropriate species, such as hydrogen and the like, in order to convert the corresponding material areas into tensile stressed materials, since it is well known that, for instance, tensile stressed silicon nitride may have a significantly higher etch rate compared to stress neutral silicon nitride material. After the modification process 278, the mask 277 and the sacrificial fill material 276 may be removed, for instance, by performing well-established resist strip processes based on oxygen plasma and the like.

Figure 2E:
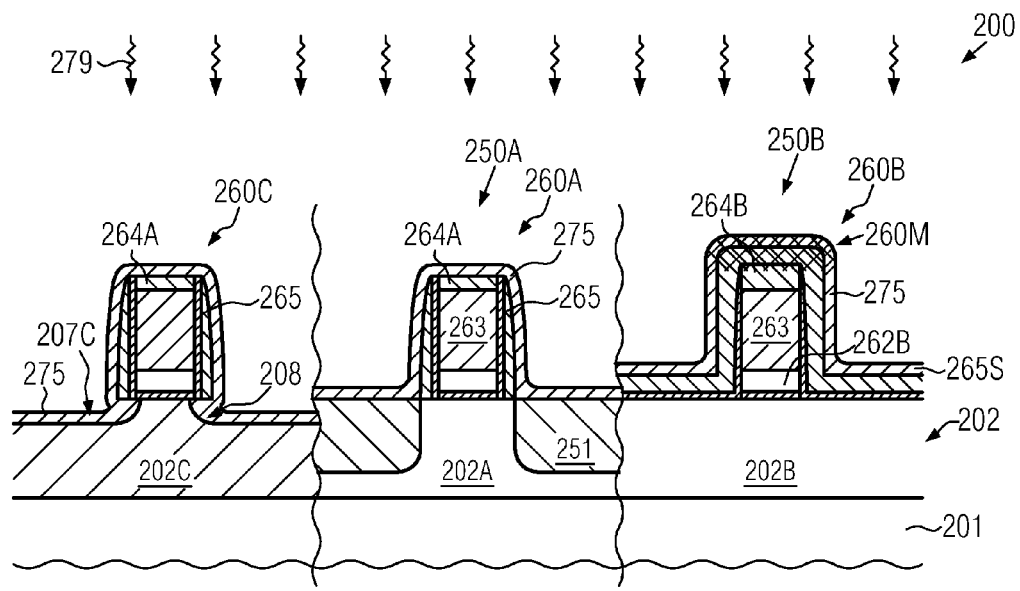

FIG. 2e schematically illustrates the device 200 during an anneal process 279, which may be performed, in some illustrative embodiments, to further enhance the degree of modification within the materials 275, 265S and 264B, thereby forming a modified portion 260M. It should be appreciated that the anneal process 279 may be performed prior to the removal of any sacrificial materials, if these materials withstand the required temperature for forming the modified portion 260M. For example, a significant degree of tensile strain may be created during the previous implantation and possibly during the heat treatment 279, depending on the previously introduced species. In other cases, an oxygen-enriched silicon nitride material may be selectively formed in the modified portion 260M, wherein a further pronounced difference in etch rate with respect to the non-treated materials 275, 265 and 264A of the gate electrode structures 260A, 260C may be achieved. It should be appreciated that appropriate process temperatures may be determined on the basis of experiments and the like. For example, elevated temperatures of 300-1100° C. may be applied in a substantially inert atmosphere.

Figure 2F:
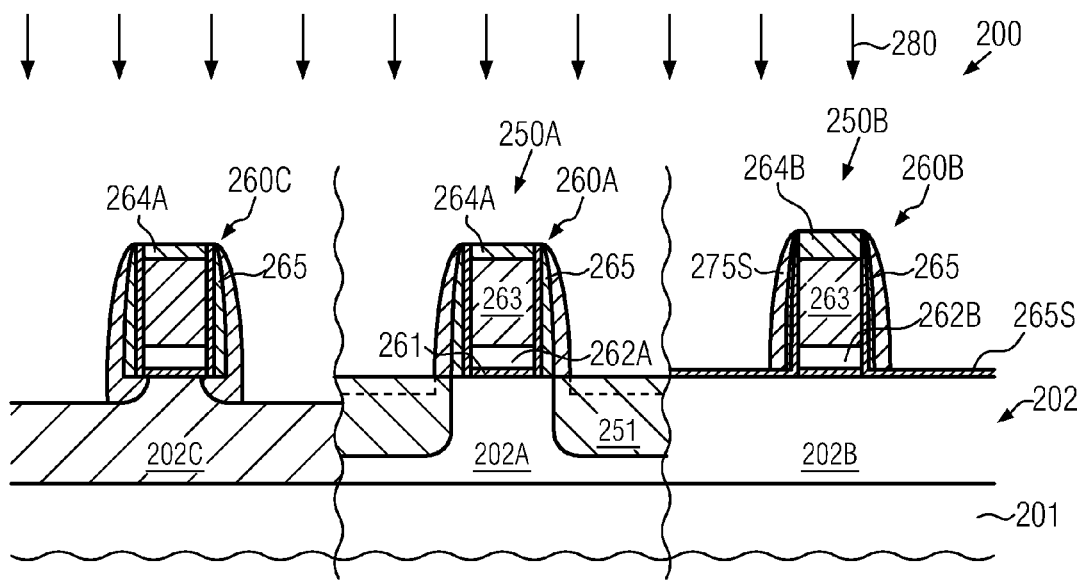

FIG. 2f schematically illustrates the device 200 during an etch process 280 in which an appropriate etch chemistry may be applied on the basis of a plasma chemistry, for example a plurality of well-established recipes are available for etching silicon nitride selectively with respect to silicon and silicon dioxide. Consequently, during the etch process 280, the dielectric materials formed above the gate electrode structure 260B may be removed with increased etch rate, thereby increasingly forming a spacer 275S from the spacer layer 275 (FIG. 2e), wherein the material removal on top of the gate electrode structure 260B may be faster compared to horizontal device portions above the active region 202B. On the other hand, the material removal at the top area of the gate electrode structures 260A, 260C may advance with reduced speed, since the materials 264A and 275 (FIG. 2e) may have their initial removal rate that is reduced compared to the modified portion formed above the gate electrode structure 260B (FIG. 2e). Consequently, during the advance of the etch process 280, increasingly the cap layers 264A and 264B may be exposed and the corresponding thickness of these layers may increasingly become similar due to the faster etch rate of the cap layer 264B, or at least a significant portion thereof. Consequently, after removing the spacer layer 275 from the regions 202C, 202A, the spacer layer 265S may still have to be etched above the active region 202B. Consequently, the etch process may be continued so as to also expose the active region 202B, which may result in a certain degree of material erosion in the active region 202A and possibly in the isolation region 202C, however, to a significantly lesser amount compared to conventional etch strategies in which corresponding sacrificial oxide spacers have to be removed.

Figure 2G:
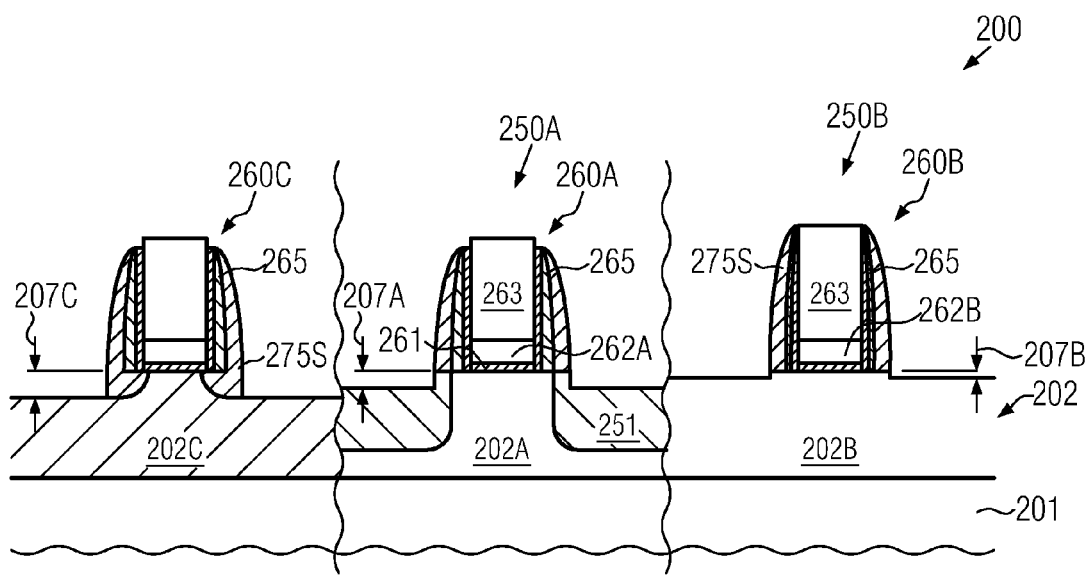

FIG. 2g schematically illustrates the semiconductor device 200 after completing the etch process 280 of FIG. 2f. As shown, the spacers 275S may be formed on the sidewall spacer structure 265, wherein, due to the different degree of exposure, the height of the spacers 275S formed on the gate electrode structures 260A, 260B may be less compared to a height level of the spacer 275S formed on the spacer structure 265 of the gate electrode structure 260B. Furthermore, the reliable removal of the cap layers 264A, 264B (FIG. 2O and of the spacer layer 265S (FIG. 2O may result in a certain recessing 207A and 207B in the active regions 202A, 202A and also the recess 207C may be increased during the etch process 280 of FIG. 2f, however, with a significantly lower effect compared to the conventional process strategy. Furthermore, as shown, the spacer 275S formed on the gate electrode structure 260C may still reliably encapsulate any critical areas, as is for instance discussed above with reference to FIG. 2b. Hence, the spacer 275S may extend below the spacer structure 265 and may thus preserve integrity of any sensitive gate materials of the structure 260C. In this manner, any device irregularities, which may be caused by undue contact of sensitive gate materials with any aggressive process atmospheres during the further processing, may be significantly reduced, thereby particularly reducing the risk of creating device failures caused by a weak spot in the encapsulation of gate electrode structures formed in close proximity to the active region 202A. Moreover, due to the superior controllability of the overall process flow, also the degree of recessing 207A in the active region 202A may be predictable and thus an undesired recessing of the strain-inducing material 251 may be compensated for by appropriately adjusting the process parameters during a selective epitaxial growth process for forming the material 251 in an early manufacturing stage, as is also discussed above.

Figure 2H:
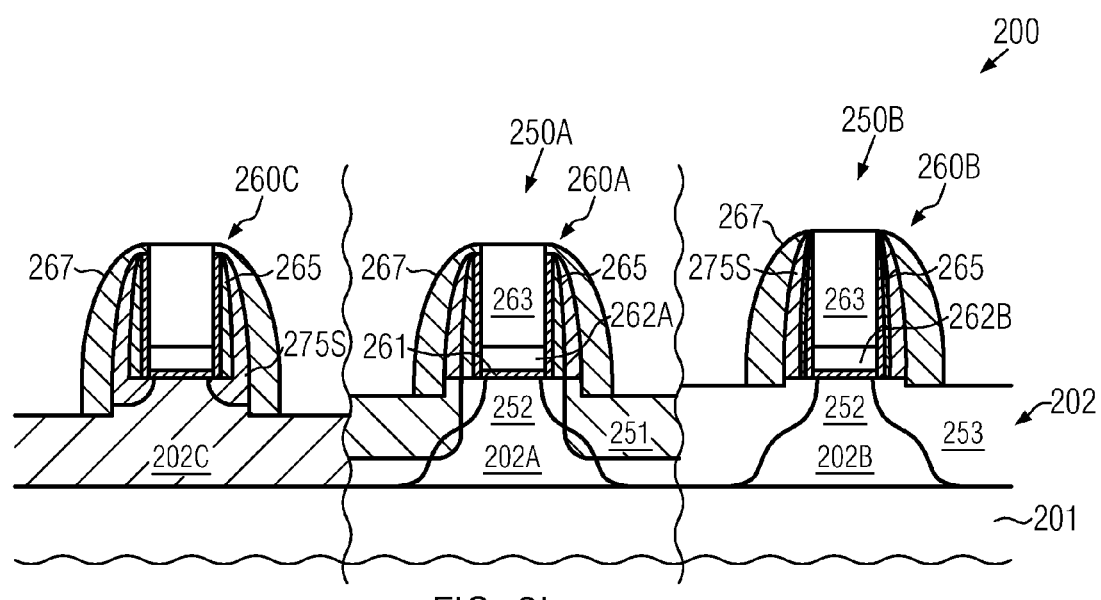

FIG. 2h schematically illustrates the semiconductor device 200 in a further advanced stage in which a further spacer structure 267 may be formed on sidewalls of the gate electrode structures 260A, 260B, 260C, i.e., on the previously provided spacers 275S, which may provide superior encapsulation, in particular of the gate electrode structure 260C, and which may also enable a reliable removal of the dielectric cap layers without requiring any additional sacrificial spacer elements. Furthermore, the width of the spacer elements 275S may be appropriately selected, in combination with the spacer structure 265, so as to act as an appropriate implantation mask for defining an offset of drain and source extension regions, halo regions and the like. On the other hand, the spacer structure 267 may enable an appropriate lateral and vertical profiling of drain and source regions 253, the final configuration may be adjusted on the basis of well-established anneal techniques and the like. It should be appreciated that the spacer structures 267 and the drain and source regions 253 may be provided on the basis of well-established process strategies.

As a result, a significantly reduced surface topography, in particular in isolation regions adjacent to active regions having incorporated therein a strain-inducing semiconductor alloy, may be achieved with superior integrity of the sensitive gate materials, while at the same time dielectric cap materials may be removed without requiring sacrificial oxide spacers, thereby providing an increased process window for removing the dielectric cap materials. On the other hand, the reduced surface topography and the superior encapsulation of the gate electrode structures may provide enhanced transistor performance and reduced transistor variability in sophisticated semiconductor devices comprising high-k metal gate electrode structures that are formed in an early manufacturing stage.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a strain-inducing semiconductor material in a first active region of a first transistor in the presence of a first gate electrode structure formed above said first active region while covering a second active region of a second transistor and a second gate electrode structure formed above said second active region with a first spacer layer, said first gate electrode structure comprising a first spacer and a first dielectric cap layer, said second gate electrode structure comprising a second dielectric cap layer;

forming a second spacer layer above said first and second active regions after forming said strain-inducing semiconductor material;

selectively modifying an etch rate of said second dielectric cap layer so that said selectively modified etch rate is greater than an etch rate of said first dielectric cap layer when said first and second dielectric cap layers are exposed to a common etch process, wherein selectively modifying said etch rate of said second dielectric cap layer comprises performing an ion bombardment;

after selectively modifying said etch rate of said second dielectric cap layer, performing at least one etching process on said second spacer layer to form second spacers adjacent said first and second gate structures;

after forming said second spacers, removing said first and second dielectric cap layers; and forming drain and source regions in said first and second active regions.

2. The method of claim 1, wherein performing said ion bombardment comprises incorporating an oxygen species into said second dielectric cap layer.

3. The method of claim 1, wherein selectively modifying said etch rate of said second dielectric cap layer comprises generating a tensile stress in said second dielectric cap layer.

4. The method of claim 1, wherein selectively modifying said etch rate of said second dielectric cap layer further comprises annealing said semiconductor device prior to removing said first and second dielectric cap layers.

5. The method of claim 1, wherein selectively modifying said etch rate of said second dielectric cap layer further comprises forming a sacrificial fill material above at least said first and second active regions so as to laterally embed said first and second gate electrode structures and, after selectively modifying said etch rate of said second dielectric cap layer, removing said sacrificial fill material from above said first and second active regions.

6. The method of claim 5, wherein forming said sacrificial fill material comprises forming said sacrificial fill material such that an upper surface of said sacrificial fill material is positioned at a level that is below an upper surface of said second dielectric cap layer and above a level of an upper surface of said first dielectric cap layer.

7. The method of claim 1, wherein forming said strain-inducing semiconductor material in said first active region comprises adjusting a fill height caused by said strain-inducing semiconductor material so as to adjust a height difference of said first and second active regions.

8. The method of claim 1, wherein performing said ion bombardment comprises incorporating a hydrogen species into said second dielectric cap layer.

9. A method of forming a semiconductor device, the method comprising:

forming a strain-inducing semiconductor alloy in a first active region in the presence of a first gate electrode structure of a first transistor, while masking a second gate electrode structure and a second active region of a second transistor, said first gate electrode structure comprising a first dielectric cap layer and said second gate electrode structure comprising a second dielectric cap layer;

forming a spacer layer above said first and second gate electrode structures and said first and second active regions;

selectively increasing an etch rate of said second dielectric cap layer so that said selectively increased etch rate is greater than an etch rate of said first dielectric cap layer when said first and second dielectric cap layers are exposed to a common etch process, wherein selectively increasing said etch rate of said second dielectric cap layer relative to said etch rate of said first dielectric cap layer comprises incorporating an ion species into said second dielectric cap layer by performing an ion implantation process; and after selectively modifying said etch rate of said second dielectric cap layer, performing an etch process on said spacer layer so as to expose portions of said first and second active regions and to form spacer elements adjacent said first and second gate electrode structures from said spacer layer.

10. The method of claim 9, further comprising performing an anneal process after said ion implantation process.

11. The method of claim 9, wherein selectively increasing an etch rate of said second dielectric cap layer relative to an etch rate of said first dielectric cap layer comprises providing said second dielectric cap layer as a silicon nitride material and creating a tensile stress selectively in said silicon nitride material.

12. The method of claim 9, wherein selectively increasing an etch rate of said second dielectric cap layer relative to an etch rate of said first dielectric cap layer comprises forming a sacrificial fill material above at least said first and second active regions so as to laterally embed said first and second gate electrode structures and, after selectively modifying said etch rate of said second dielectric cap layer, removing said sacrificial fill material from about said first and second active regions.

13. The method of claim 12, wherein forming said sacrificial fill material comprises forming said sacrificial fill material such that an upper surface of said sacrificial fill material is positioned at a level that is below an upper surface of said second dielectric cap layer and above a level of an upper surface of said first dielectric cap layer.

14. The method of claim 9, wherein said ion species incorporated into said second dielectric cap layer by said ion implantation process is a hydrogen species.

15. The method of claim 9, wherein said ion species incorporated into said second dielectric cap layer by said ion implantation process is an oxygen species.

* * * * *